May 12, 1970 D. R. LANCE, JR., ET AL 3,512,105

LINEAR VOLTAGE TUNED MICROWAVE RESONANT CIRCUITS AND OSCILLATORS

Filed April 29, 1968 2 Sheets-Sheet 1

INVENTORS
DREW R. LANCE JR.
STEVEN B. RUPP

BY [signature]
ATTORNEY

FIG.2
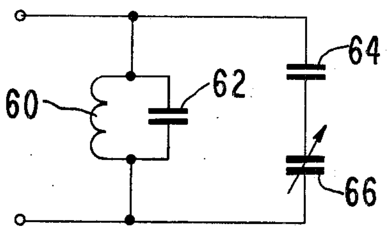
FIG.3
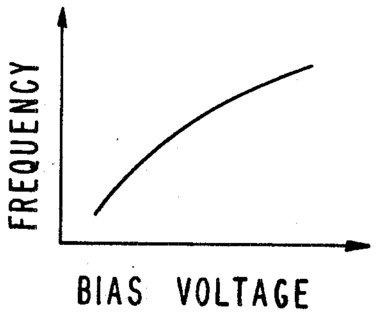
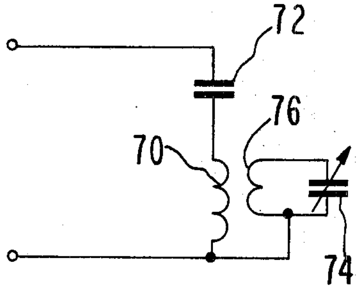
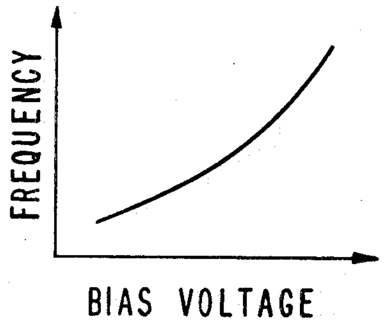
FIG.4
FIG.5
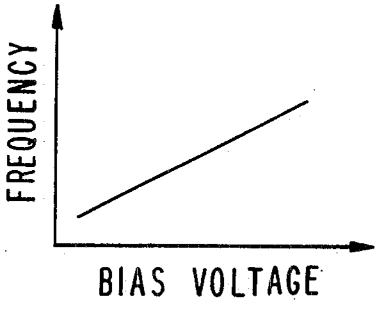
FIG.6
INVENTORS
DREW R. LANCE JR.
STEVEN B. RUPP
BY [signature]
ATTORNEY United States Patent Office 3,512,105
Patented May 12, 1970

3,512,105

LINEAR VOLTAGE TUNED MICROWAVE RESONANT CIRCUITS AND OSCILLATORS

Drew R. Lance, Jr., Saratoga, and Steven B. Rupp, San Francisco, Calif., assignors to Fairchild Camera and Instrument Corporation, Syosset, N.Y., a corporation of Delaware Filed Apr. 29, 1968, Ser. No. 724,985
Int. Cl. H01p *7/04;* H03b *5/18;* H03j *3/18*
U.S. Cl. 331—96 10 Claims

ABSTRACT OF THE DISCLOSURE

A resonant circuit may be tuned electronically and linearly by a mechanism comprising a first voltage-controlled variable capacitor inductively coupled to one portion of the resonant circuit and a second voltage-controlled variable capacitor capacitively coupled to another portion of the resonant circuit. An appropriate tuning voltage selectively applied to the two capacitors causes the operating frequency of the resonant circuit to vary as a linear function of the change in the applied tuning voltage.

BACKGROUND OF THE INVENTION

Field of the invention

This invention relates to a linear tuning mechanism for electronically tuning a resonant circuit, especially a circuit capable of operation in the micorwave frequency range. In particular, this invention relates to the use of a modulating signal to vary linearly the operating frequency of a resonant circuit at a rapid rate.

Description of the prior art

In some applications requiring the frequency variation of electrical signals, such as in frequency modulation, it is necessary that the operating frequency of the resonant circuit be changed electronically. However, in order to reduce the amount of distortion of the modulation signal to a minimum, any change in the resonant frequency should be linear, or as close thereto as possible. One component particularly suitable for use with electronic tuning signals is the varactor diode, the capacitance of which changes in response to changes in the voltage level of tuning signals applied thereto. If the varactor diode is couple to a resonant circuit, the circuit operating frequency is a function of the impedance value of the components of the resonant circuit plus the effect upon that impedance of the varactor diode capacitance. By changing the level of a tuning signal applied to the varactor diode, one may vary the diode capacitance, which in turn causes the operating frequency of the resonant circuit to change. A principal drawback to use of the varactor diode, however, is that it often causes a nonlinear change in the operating frequency, resulting in unwanted distortion.

Various prior-art methods have been used to eliminate this distortion. For example, predistorter circuits, such as nonlinear resistance networks, can be coupled to the input or output, or both, of the resonant circuit. While this method is acceptable for some applications, it is unsatisfactory for a resonant circuit operating at vary high modulation frequencies (around 5 to 7 megacycles), because of the operating characteristics of the components in the network.

In another prior art method, a second resonant circuit external to the primary resonant circuit is used to linearly change the operating frequency of the latter. However, this method requires two cavities rather than one and is undesirably bulky. Further, it is not tunable electronically and is difficult to tune across an operating bandwidth. Thus, there is a need for a method of selectively varying the operating frequency of a resonant circuit capable of operating in the microwave frequency range in such a way that the variations are linear and can be made electronically.

Summary of the invention

Briefly, the invention comprises a microwave circuit and a means for linearly varying the operating frequency of the circuit in response to a tuning signal. More particularly, the means comprises a first means coupled to the resonant circuit for selectively causing the operating frequency thereof to change in a first selected manner; a second means coupled to the resonant circuit for selectively causing the operating frequency thereof to change in a second selected manner, the first and second means operating in cooperation with each other to selectively vary the operating frequency of the resonant circuit linearly in response to changes in the tuning signal; and a third means for coupling the tuning signal to the first and second means.

Brief description of the drawings

FIG. 2 is a schematic circuit diagram of the electrical equivalent of the high-voltage end of a resonant line, to which is capacitively coupled a tuning varactor diode;

FIG. 3 graphically indicates the relation between the change in tuning voltage applied to the varactor diode shown in FIG. 2 and the change in operating frequency of the resonant line;

FIG. 4 is a schematic circuit diagram showing the electrical equivalent of the high-current end of a resonant line, to which is inductively coupled a tuning varactor diode;

FIG. 5 graphically indicates the relation between the change in tuning voltage applied to the varactor diode shown in FIG. 4 and the change in resonant frequency of the resonant line;

FIG. 6 graphically indicates the result of superimposing the effect shown in FIGS. 3 and 5 upon the operating frequency of the resonant line; and, FIG. 7 is a simplified schematic drawing of the cross section of an alternative embodiment of the invention.

Description of the preferred embodiments

Although the resonant circuit to be tuned may comprise various forms, one especially suitable embodiment is a resonant line having a resonant frequency, an electrical length equivalent to a positive, nonzero, integral multiple of one-quarter of the wavelength of the resonant frequency, and a high-current portion and a low-current portion.

Figure 1:
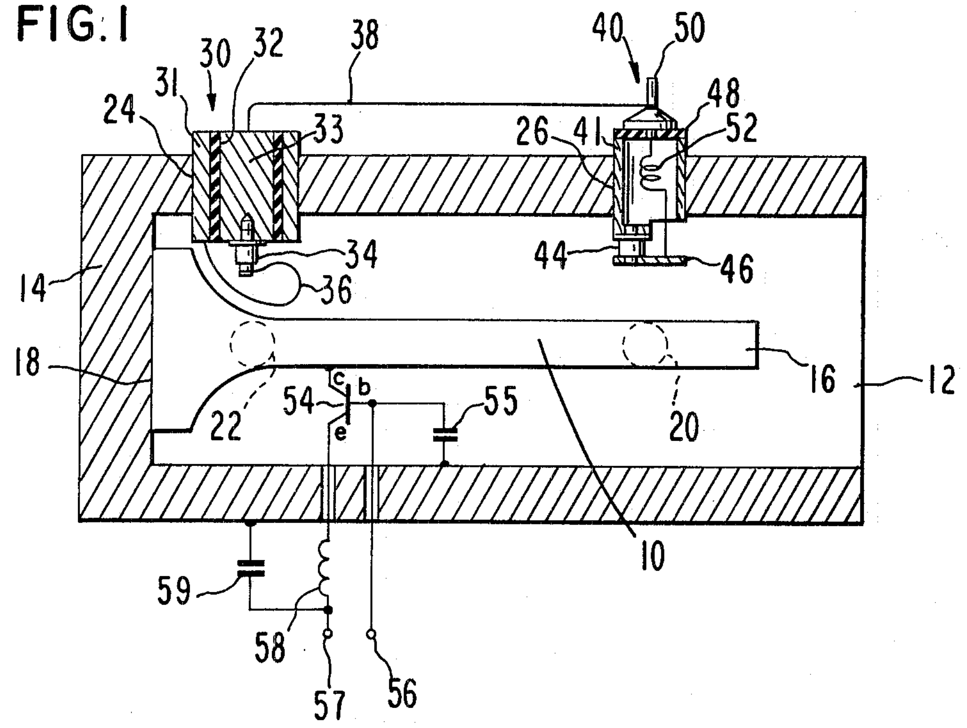
FIG. 1 is a simplified schematic drawing of the cross section of one embodiment incorporating the principal features of the invention.

Referring to FIG. 1, the resonant line 10 is in the form of a rod of highly conductive material, such as brass or copper, and is located within the cavity 12 of a suitable housing 14, which also is of a conductive material, such as copper. In addition to providing a support, the metallic housing 14 provides a ground plane, and shielding. The resonant line 10 has an open end 16 and a closed end 18, the latter supportably attached to the housing 14. At the open end 16 is a high-voltage point 20 having the electrical characteristics of a parallel-tuned circuit, while near the closed end 18 is a high-current point 22 having the electrical characteristics of a series- tuned circuit.

The housing 14 is conveniently formed so that the respective first and second sleeves 30 and 40 comprising suitable components for adjusting the operating frequency of the resonant line 10 may be inserted into the housing 14 and supported therein for suitable electrical coupling to the resonant line 10. The first sleeve 30 has an outer conductive portion 31 (preferably of metal such as brass), a middle nonconductive portion 32 (preferably of a dielectric such as Teflon, Mylar, or a cross-linked polystyrene such as Rexolite), and an inner conductive portion 33 (preferably of a metal such as brass). The sleeve 30 is appropriately formed for insertion through hole 24, which is aligned with the high-current point 22. A first varactor diode 34 is located in one end of the inner portion 33 of the sleeve 30 nearest the resonator 10, and a tuning loop 36 of wire is coupled between the outer portion 31 of the sleeve 30 and the varactor diode 34 and fromed to pass close to the resonant line 10 for inductively coupling the capacitance of the varactor diode 34 to the high-current portion 22. The nonconducting material 32 placed between the inner and outer conductive portions 33 and 31 of the sleeve 30 provides a cylindrical bypass capacitor. A wire 38 is coupled to the other end of the inner portion 33 of the sleeve for applying a tuning voltage thereto in order to vary the capacitance of the varactor diode 34.

The second sleeve 40 has an outer conductive portion 41 (preferably of metal such as brass) appropriately formed for insertion through hole 26, which is aligned with the high-voltage point 20. A second varactor diode 44 is supportably mounted to the outer portion 41 of sleeve 40 at one end nearest the resonant line 10. A coupling capacitor 46 is supportably mounted to diode 44 and located between varactor diode 44 and the high-voltage portion 20. Located at the other end of outer portion 41 is a nonconductive material 48 (preferably ceramic), on top of which is mounted an input terminal 50 (suitably of a conductive material such as brass or copper) for applying a tuning voltage to the first and second sleeves 30 and 40. Nonconductive material 48 enables a bypass capacitance to appear between input terminal 50 and outer portion 41. Coil 52 is coupled between capacitor 46 and input terminal 50 to provide inductive isolation therebetween. Input terminal 50 is also coupled to the inner portion 33 of the first sleeve 30 by a wire 38. A suitable tuning signal applied to input terminal 50 functions to control the capacitance of both the first and second varactor diodes 34 and 44.

The high-voltage point 20 of the resonant line 10 has the electrical characteristics of a parallel resonant circuit, which is represented schematically in FIG. 2 by coil 60 connected in parallel with capacitor 62. Coupled across this parallel circuit by coupling capacitor 64 (capacitor 46 in FIG. 1) is the tunable varactor diode 66 (diode 44 in FIG. 1). If $L_o$ and $C_o$ are the effective inductance of coil 60 and capacitance of capacitor 62 which determine the unperturbed resonant frequency $\omega_o$ of the resonator, then $$\omega_o = \frac{1}{\sqrt{L_o C_o}} \qquad (1)$$

Further, if $C_c$ is the capacitance of the coupling capacitor 64 and $C_v$ is the capacitance of the varactor diode 66, then the reactance of the circuit of FIG. 2 at some frequency $\omega$ is:

$$X(\omega) = \frac{1}{\frac{1}{\omega L_o} - \omega\left(C_o + \frac{C_c C_v}{C_c + C_v}\right)} \qquad (2)$$

The circuit is resonant when $X(\omega_r) = \infty$; that is, when $$\omega_r L_o - \frac{1}{\omega_r\left(C_o + \frac{C_c C_v}{C_c + C_v}\right)} = 0;\ \omega_r = \text{resonant frequency} \qquad (3)$$

If $L_o$, $C_o$ and $C_c$ are constants, then the resonant frequency, $\omega_r$, must increase as $C_v$ decreases; also, as $C_v$ approaches zero, $\omega_r$ approaches the unperturbed resonant frequency, $\omega_o$, $\omega_r$ always being $\leq \omega_o$.

The change in varactor capacitance, $C_v$, as a function of applied reverse bias voltage, $V_{bias}$, is $$C_v \approx \frac{C_{vo}}{(1=2V_{bias})1/3} \qquad (4)$$

where $C_{vo}$ is the capacitance of the varactor at $V_{bias}=0$. As a result of the decreasing rate of change of the varactor capacitance, $C_v$, with increased applied voltage, $V_{bias}$, and the asymptotic approach of the circuit resonant frequency, $\omega_r$, to the unperturbed resonant frequency, $\omega_o$, the rate at which the resonant frequency changes for a given change in applied voltage decreases as the voltage level increases. A plot of frequency versus applied bias voltage (see FIG. 3) indicates that increasing the bias voltage on the varactor diode 66 causes the resonant frequency, $\omega_r$, to increase at a decreasing rate, and decreasing the bias voltage causes the frequency to decrease at an increasing rate.

Referring to FIG. 4, the high-current point 22 (FIG. 1) of the resonant line 10 (FIG. 1) has the electrical characteristics of a series resonant circuit, represented schematically by coil 70 connected in series with capacitor 72. The capacitance of tunable varactor 74 is inductively coupled to coil 70 and the resonant circuit by coupling coil 76, which is connected across varactor 74. Letting $L_o$ represent the inductance of coil 70, $C_o$ the capacitance of capacitor 72, $C_v$ the capacitance of varactor 74, and $L_1$ the inductance of coupling coil 76, the reactance, X, as a function of frequency, $\omega$, is $$X(\omega) = \omega L_o - \frac{1}{\omega C_o} + \frac{\omega^3 M^2}{L_1(\omega_1^2 - \omega^2)} \qquad (5)$$

where M is the coupling coefficient between $L_o$ and $L_1$, and $\omega_1^2 = 1/L_1 C_v$. At the resonant frequency, $\omega_r$, of the circuit, the reactance, $X(\omega_r)$, equals zero or, $$\omega_r L_o - \frac{1}{\omega_r C_o} + \frac{\omega_r^3 M^2}{L_1(\omega_1^2 - \omega_r^2)} = 0 \qquad (6)$$

If $\omega_1$ is chosen less than $\omega_r$, then as $\omega_1$ approaches $\omega_r$, not only does $\omega_r$ increase, but $1/(\omega_1^2 - \omega_r^2)$ approaches a singularity so that the rate of increase of the resonant frequency, $\omega_r$, for a given change in $\omega_1$ increases as $\omega_1$ increases.

Now, $$\omega_1 \approx \frac{(1+2V_{bias})^{1/6}}{\sqrt{L_1 C_{vo}}} \qquad (7)$$

Therefore, $\omega_1$ must be chosen near enough to $\omega_r$ so that the nonlinearity of approaching the singularity of Equation 6 dominates over the opposing nonlinearity of Equation 7. When $\omega_1$ is less than $\omega_r$, but near enough that the singularity of Equation 6 dominates, then the plot of frequency versus $V_{bias}$ is as illustrated in FIG. 5. Here, it can be seen that increasing the bias voltage on the varactor diode 74 causes the resonant frequency, $\omega_r$, to increase at an increasing rate, while decreasing the bias voltage causes the resonant frequency to decrease at a decreasing rate.

Referring to FIG. 6, when the effect of the circuit of

FIG. 2 having the characteristic indicated in FIG. 3 and the effect of the circuit of FIG. 4 having the characteristic indicated in FIG. 5 are superimposed upon one another, a linear relationship is obtained between change in bias voltage and change in resonant frequency. Thus, by varying the bias voltage, one may electronically cause the frequency to change linearly, thereby electronically tuning the resonant line.

A linear tuning mechanism for electronically tuning a resonant circuit comprising the embodiment hereinbefore described has been successfully built and tested. The resonant circuit operated with a frequency of 2.2 to 2.3 gigahertz, and had a linear frequency response to change in bias voltage closer than ±2 percent to a straight line. The total frequency variation was 12 megahertz (±6 megahertz) with a bias voltage range of 20 volts peak-to-peak (6 volts to 26 volts) at a modulation rate of 6 megahertz. A prior art resonant circuit operating with a frequency of 2.2 gigahertz had a linear frequency response no closer than ±15 percent to a straight line. By comparison, the invented mechanism gives approximately an order of magnitude improvement in linearity over prior art circuits operating at similar frequency ranges.

It should be noted that numerous other embodiments may be used to incorporate the features of the invention, and should be apparent to one skilled in the art. For example, referring to FIG. 1, the overall apparatus may operate as a voltage-tuned oscillator by coupling the output (usually the collector) of a suitable transistor 54 capable of operating at the desired resonant frequency range to the resonant line 10. Suitably, a first bypass capacitor 55 is coupled between the base *b* of the transistor and the housing 14. Input terminals 56 and 57 provide a means for applying bias to the transistor 54. Terminal 56 is coupled directly to the base *b*, while coil 58 is coupled between the emitter *e* and terminal 57 in order to provide RF isolation. Further, a second bypass capacitor 59 is coupled between terminal 57 and the housing 14.

Figure 7:
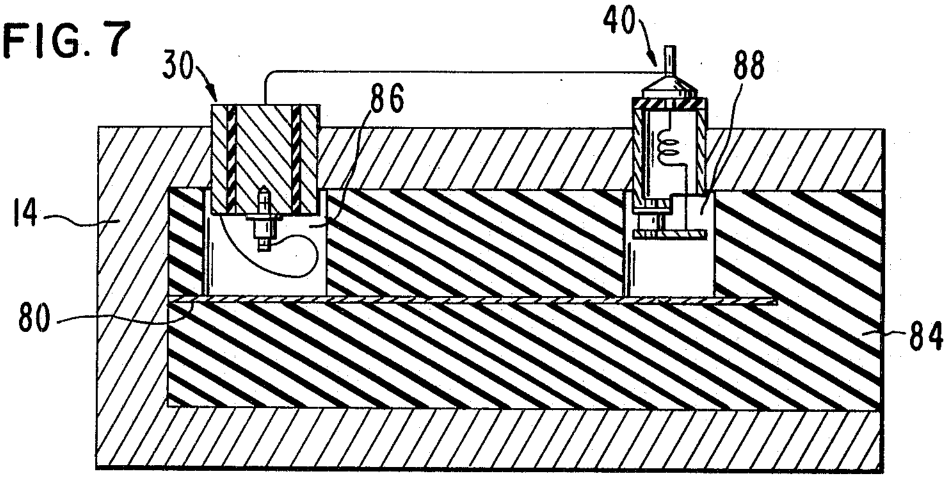

As another example, the resonant circuit may comprise a stripline cavity, shown in FIG. 7 as a strip of conductive material 80, such as copper, extending laterally through the cavity formed by the housing 14. One end thereof is mounted to the housing 14 and the other end is open. A dielectric material 84 having a low loss tangent, such as Rexolite or other cross-linked polystyrene surrounds the outer surface of the conductivity strip 80 and extends thserefrom, preferably to the inner surface of the housing 14, thereby filling the cavity. Suitably, portions of the dielectric 84 are removed in regions 86 and 88 between the first and second sleeves 30 and 40 and the conductive strip 80, allowing coupling to occur therebetween.

As a third example, the resonant line may comprise a microstripline cavity, an embodiment similar in part to the stripline cavity described above. However, dielectric material 84 here (which may comprise a ceramic) surrounds only a portion of the surface of conductive strip 80 farthest away from the first and second sleeves 30 and 40, fand extends therefrom suitably to a portion o the inside surface of the housing. Preferably, no dielectric material is located between the conductive strip 80 and the first and second sleeves 30 and 40. An appropriate transistor may be coupled to the highly conductive strip 80 of FIG. 7 in a manner similar to that shown in FIG. 1 whereby the apparatus of FIG. 7 will also operate as a voltage-tuned oscillator.

What is claimed is:

1. Apparatus comprising:
a microwave resonant circuit; and,
means for linearly varying the operating frequency of the circuit in response to a tuning signal, the means comprising:
a first tuning means capacitively coupled to the resonant circuit for selectively causing the operating frequency thereof to change in a first selected manner;

a second tuning means inductively coupled to the resonant circuit for selectively causing the operating frequency thereof to change in a second selected manner, the first and second tuning means operating in cooperation with each other to selectively vary the operating frequency of the resonant circuit linearly in response to changes in the tuning signal; and,
a third means for coupling the tuning signal to the first and second tuning means.

2. The apparatus recited in claim 1 wherein the first and second tuning means comprise respective first and second voltage-controlled variable capacitors.

3. The apparatus recited in claim 2 wherein the first and second capacitors comprise respective first and second varactor diodes.

4. Apparatus as recited in claim 2 further defined by said microwave resonant circuit comprising a microwave oscillator.

5. Apparatus which comprises:
a resonant line having an electrical length substantially equivalent to a positive, nonzero, integral multiple of one-quarter the wavelength of the resonant frequency of the line, the line also having a high-current portion and a high-voltage portion; and,
a linear tuning mechanism for electronically tuning the resonant line in response to a tuning signal comprising:
a first means having a voltage-controlled variable capacitor inductively coupled to the high-current portion for selectively causing the operating frequency of the resonant line to increase at an increasing rate in response to an increase in the tuning signal and to decrease at a decreasing rate in response to a decrease in the tuning signal;
a second means having a voltage-controlled variable capacitor capacitively coupled to the high-voltage portion for selectively causing the operating frequency of the resonant line to increase at a decreasing rate in response to an increase in the tuning signal and to decrease at an incresing rate in response to a decrease in the tuning signal, the first and second means operating in cooperation with each other to selectively vary the operating frequency of the resonant linerarly in response to changes in the tuning signal; and,
a third means for coupling the tuning signal to the first and second means.

6. The apparatus recited in claim 5 wherein the voltage-controlled variable capacitor of ethe first means comprises a first varactor diode; and the voltage-controlled capacitor of the second means comprises a second varactor diode;

7. The apparatus recited in claim 6 further defined by a housing of conductive material shaped to form a cavity;
the resonant line located within the cavity and having at least two ends;
the first means supportably mounted to said housing adjacent the high current portion; and
the second means supportably mounted to the housing adjacent the high-voltage portion.

8. The mechanism recited in claim 7 wherein the resonant line comprises a laterally extending conductive material.

9. The mechanism recited in claim 7, wherein the resonant line comprises a laterally extending conductive material having a surface, a portion of the surface farthest away from the first and second varactor diodes surrounded by a dielectric material extending therefrom.

10. The mechanism recited in claim 7 wherein the resonant line comprises a laterally extending conductive material having a surface, the surface surrounded by a dielectric material extending therefrom with portions of the dielectric material selectively removed between the high-current portion and high-voltage portion of the resonant line and the first and second varactor diodes to allow electrical coupling to occur therebetween.

References Cited

UNITED STATES PATENTS

| | | | |
|---|---|---|---|
| 3,117,293 | 1/1964 | Mortley | 334—15 |
| 3,246,266 | 4/1966 | Racy | 333—83 |
| 3,377,568 | 4/1968 | Kruse et al. | 331—177 X |
| 3,409,845 | 11/1968 | Masaka Ogi et al. | 331—177 X |

OTHER REFERENCES

Akio Sasaki: "Can Varactors Get Rid of FM Distortion in Reflex Klystrons?" Electronics, Aug. 3, 1962, pp. 42–45.

ROY LAKE, Primary Examiner

S. H. GRIMM, Assistant Examiner

U.S. Cl. X.R.

331—99, 101, 117, 177; 332—30; 332—30; 333—83; 334—15